United States Patent
Lee et al.

(10) Patent No.: US 6,275,417 B1
(45) Date of Patent: Aug. 14, 2001

(54) MULTIPLE LEVEL FLASH MEMORY

(75) Inventors: Peter W. Lee, Saratoga; Fu-Chang Hsu; Hsing-Ya Tsao, both of San Jose, all of CA (US)

(73) Assignee: Aplus Flash Technology, Inc., San Jose, CA (US)

( * ) Notice: Subject to any disclaimer, the term of this patent is extended or adjusted under 35 U.S.C. 154(b) by 0 days.

(21) Appl. No.: 09/680,651

(22) Filed: Oct. 6, 2000

Related U.S. Application Data

(60) Provisional application No. 60/158,325, filed on Oct. 8, 1999.

(51) Int. Cl.[7] .................................................. G11C 16/04
(52) U.S. Cl. .................................. 365/185.19; 365/185.2; 365/185.03; 365/189.09
(58) Field of Search ........................... 365/185.19, 185.2, 365/185.03, 189.09

(56) References Cited

U.S. PATENT DOCUMENTS

| | | | |
|---|---|---|---|
| 5,508,958 | * | 4/1996 | Fazio et al. ...................... 365/185.19 |
| 5,748,533 | * | 5/1998 | Dunlap et al. ................... 365/185.19 |
| 5,877,984 | * | 3/1999 | Engh ................................ 365/185.19 |
| 5,901,089 | * | 5/1999 | Korsh et al. ..................... 365/185.24 |
| 5,943,260 | * | 8/1999 | Hirakawa ......................... 365/185.03 |
| 5,963,462 | * | 10/1999 | Engh et al. ............................. 365/45 |
| 6,178,118 | * | 1/2001 | Lin et al. ......................... 365/185.28 |
| 6,195,283 | * | 2/2001 | Rolandi et al. .................. 365/185.03 |

* cited by examiner

Primary Examiner—Richard Elms
Assistant Examiner—Tuan T. Nguyen
(74) Attorney, Agent, or Firm—Flehr Hohbach Test Albritton & Herbert LLP

(57) ABSTRACT

Data stored in multi-level memory cells is rapidly read out with high resolution by generating and coupling a predetermined and preferably low number of large magnitude jump-like voltage changes to the control gates of the memory cells. The magnitude of the jumps can be a substantial fraction of the power supply level and will be many times the $\Delta Vt$ levels associated with the memory cells, e.g., the control gate voltage changes in jump-steps from say 4 V to 6 V to 8 V. Use of a low number of jump-steps (e.g., two or three) reduces read out time by permitting read out of a plurality of Vt levels during a given control voltage magnitude. Further, use of large but different magnitude control gate voltages provides good read out resolution over the range of Vt values. Reference cells are provided to improve tracking, and DRAM-type sense amplifiers are provided to maintain high noise immunity.

15 Claims, 7 Drawing Sheets

FIG. 6B
FIG. 6C
FIG. 6D
FIG. 6E
FIG. 6F
SE
SEB
LA
LAB
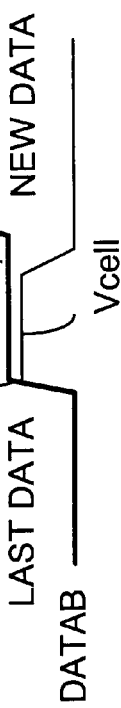
NEW DATA
Vref
Vcell
DATA
LAST DATA
DATAB
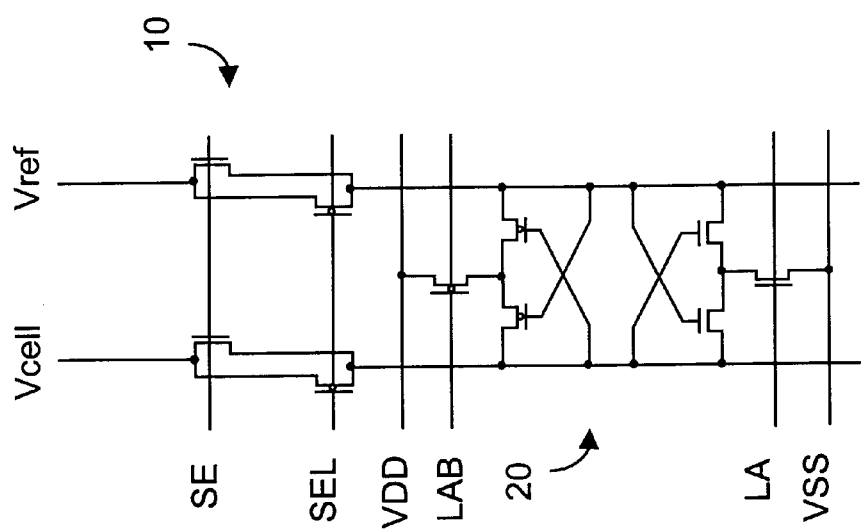
FIG. 6A

MULTIPLE LEVEL FLASH MEMORY

RELATIONSHIP TO PENDING APPLICATIONS

Priority is claimed from U.S. provisional patent application Ser. No. 60/158,325 filed on Oct. 8, 1999 by applicants Lee, Hsu, and Tsao herein, and entitled "Multiple Level Flash Memory".

FIELD OF THE INVENTION

The present invention is directed general to non-volatile memory including so-called multiple-level memory capable of storing more than one data-bit per cell, and more particularly to circuits and techniques for reading date from multiple-level non-volatile memory cells.

BACKGROUND OF THE INVENTION

Historically non-volatile memory such as electrically erasable programmable read-only-memory (EEPROM) or flash memory provided memory cells that were binary, and could store a single bit, e.g., a logical or binary "0" or "1". A typical memory cell is a MOS device that includes source and drain regions formed in a substrate, a floating gate separated from the source, drain, and intermediate region of the substrate by a thin oxide layer, and an overlying control gate separated from the floating gate by a thicker oxide layer.

Coupling appropriate voltage levels to the control gate, source, or drain can cause electrons to collect on the floating gate, where their presence tends to counteract the voltage level on the floating gate, reducing source-drain current flow through the cell. A sense amplifier coupled to the source of the cell can detect the reduced current flow and report a "0" as being stored in the cell. On the other hand, when the cell is erased by coupling appropriate voltages to the control gate, source, or drain, the floating gate retains minimal charge and control gate potential will turn-on the cell, producing drain-source current flow that the sense amplifier reports as a stored "1".

Discerning whether a memory cell is storing a "0" or "1" is straightforward. But more recently, in an attempt to increase storage density and low storage cost per bit, so-called multi-level EEPROM and flash memory units have been developed in which a memory cell can store more than one-bit of data. In essence the memory cell now stores what may be described as analog values and the multiple-level cell is characterized by an analog voltage threshold value, Vt. Although multi-level cells and arrays can provide density and cost advantages, it is more difficult to read and identify multiple values stored in a cell, than to read whether the cell is turned off ("0") or on ("1").

Assume a multi-level cell is to store one of sixteen levels. If the analog Vt distribution is from about 1.0 VDC to about 5.5 VDC, the ΔVt value associated with a given storage level is only 300 mV, e.g., (5.5–1.0)/15. Discerning which of the multiple levels has been stored requires accurately and preferably rapidly discerning between ΔVt values that are only 300 mV apart. The requirement to accurately sense with sufficient resolution of at least 300 mV over a range of about 1.0 VDC to about 5.5 VDC can be challenging in practice.

Several solutions have been directed to the problem of reading from multi-level memory cells. For example, U.S. Pat. No. 5,508,958 to Fazio, et al. (1996) and U.S. Pat. No. 5,751,635 to Wong, et al. (1998) disclose techniques for sensing the state of floating gate memory cells by applying a step-wise increasing variable voltage to the control gate of the memory cells. FIG. 1 herein exemplifies this approach, in which a stepwise-increased voltage (or ramped voltage) is applied to the control gates of cells to alter the drain-source channel current (Ids) of the cells. The value of Ids will change stepwise, according to the difference between the nominal Vt value for the cell, and the control gate voltage at the moment.

In Fazio '958 and Wong '635 configurations, sensing DIDS involves coupling a fixed reference current loading to the drain node of the memory cell, to form a ratio-type sense amplifier. When control gate voltage is less than Vt for a cell, Ids for that cell will be less than a pre-selected reference current, which causes the sense amplifier output to be "1". This sense amplifier reading indicates that the control gate voltage should be further increased, until a predetermined value exceeding the cell Vt is attained. When the control gate ramp voltage level exceeds the cell Vt, Ids will exceed the reference current, which pulls the sense amplifier output low, which allows the value of the cell data to be determined.

FIG. 2 is an exemplary graph of Ids distribution for a multi-level memory cell having sixteen levels of analog Vt values ranging from Vt1=1 V to Vt16=7.5 V, when applying drain voltage of 1 V and sweeping the control gate voltage VG. In Fazio-Wong systems, the sense amplifier output is almost digital in that large voltage swings occur. If there are sixteen Vt levels ranging from about 1 VDC to about 7.5 VDC, the ΔVt per storage level will be on the range of about 0.5 V. Referring to FIG. 2, assume that the reference current is selected as 40 μA. The horizontal row of black dots in FIG. 2 represents the sixteen gate voltages required to read out the respective sixteen levels of Vt for the memory cell. Note that since cell current Ids is compared with a fixed reference current using a ramp-like gate voltage, a linear current difference between adjacent Vt levels can be maintained, along with a reasonable operating margin. Thus, Fazio-Wong type read out can offer advantages including improved read out resolution, and higher sense amplifier noise immunity margin. Typically a Fazio-Wong type system can implement perhaps thirty-two to one-hundred fifty-six levels of Vt per memory cell.

However, a significant drawback of the Fazio-Wong type sense scheme is the requirement for very accurate control gate voltage levels. For each ramp step, the control gate voltage must remain at a voltage level sufficiently long to attain a stable magnitude. Unfortunately this requirement decreases operating speed for the memory system, especially read access time. For a multi-level cell storing a large number of levels, i.e., 256 levels, read time can become excessive. As a result, the Fazio-Wong type approach shown in FIGS. 1 and 2 is best suited to low-speed operations, such as the storage and playback for speech data.

Further, the long read process required in a Fazio-Wong type system increases the memory cell's exposure to stress. Typically read out operations for multi-level cells requires larger magnitude control gate voltage than for binary storage cells. As a result, as long as the control gate voltage is applied to a row, or word line in an array of memory cells, all cells on the row will experience stress from the large magnitude gate voltage, and can experience a shift in cell Vt value. Therefore, it is desired to reduce read time, to reduce exposure to stress and possible disturbance of cell Vt values.

In an attempt to overcome the above-mentioned slow speed problems, alternative sensing methods have been developed, for example as disclosed in U.S. Pat. No. 5,838,612 to Calligaro et al., and U.S. Pat. No. 5,220,531 to Blythe et al. Rather than use Fazio-Wong type low-speed, stepwise increased gate voltages, in systems according to Calligaro- Blythe, a fixed gate voltage is coupled directly applied to the control gate of the memory cell. The fixed-gate voltage causes memory cells having different values of Vt to conduct different magnitudes of cell Ids drain-source channel current. In Calligaro-Blythe type systems, the memory cell drain is connected to a reference current load, such as was described above with respect to Fazio-Wong. A differential output voltage is derived from the ratio between the cell Ids current and the reference current.

But the Calliagaro-Blythe approach has a significant drawback arising from the basic characteristic of MOS devices. In a MOS memory cell, the channel current distribution for each Vt level is not linear, but rather tends to saturate as gate voltage increases relative to magnitude of Vt for the cell. FIG. 3 depicts cell current Ids for sixteen values of Vt (Vt1, Vt2, . . . Vt15, Vt16) for a fixed gate voltage, e.g., VG=8 VDC that is sufficiently high to turn-on all cells in the sixteen Vt range. Current distribution clearly is not linear. There is better current resolution in the high Vt range, but very poor resolution in the low Vt range. This phenomenon makes it very difficult to store a large number of Vt levels in a multi-level cell because resolution will be lost for the lower Vt values. Thus, the Calliagaro-Blythe approach is best used for storing a low number of Vt levels, such as four or eight levels per memory cell.

There is a need for a read out system and method for use with multi-level memory cells, in which read out can occur relatively rapidly, while maintaining acceptable read out resolution over a range of Vt levels. Such system and method preferably should be implementable inexpensively and using existing processing techniques.

The present invention provides such a system and method.

SUMMARY OF THE INVENTION

The present invention reads out data stored in multi-level memory cells by generating and coupling a predetermined and preferably low number of large magnitude jump-like voltage changes to the control gates of the memory cells. The magnitude of the jumps can be a substantial fraction of the power supply level and will be many times the $\Delta$Vt levels associated with the memory cells. For example, a first control gate voltage of perhaps 4 V is coupled to the multi-level cells, then the control gate voltage jumps to perhaps 6 V, then to 8 V, rather than slowly increase step-wise as in the prior art. The use of a relatively low number (e.g., two, three, etc.) of large magnitude step control gate voltages (e.g., 4 V, 6 V, 8 V) substantially reduces read out time by permitting read out of a plurality of Vt levels during a given control voltage magnitude. Further, the use of large but different magnitude control gate voltages provides good read out resolution over the range of Vt values. The present invention further includes reference cells that help improve tracking against variation in fabrication process, power supply, and temperature. Further, the present invention preferably uses high sensitivity, high noise immunity DRAM-type sense amplifiers to further improve read out performance.

Other features and advantages of the invention will appear from the following description in which the preferred embodiments have been set forth in detail, in conjunction with the accompanying drawings.

BRIEF DESCRIPTION OF THE DRAWINGS

FIG. 6A depicts a preferred embodiment of a DRAM-type sense amplifier used to read-out multi-level memory cells, according to the present invention;

FIGS. 6B–6F depict waveforms present at various nodes in the DRAM-sense amplifier shown in FIG. 6A, according to the present invention.

DETAILED DESCRIPTION OF THE PREFERRED EMBODIMENT

As noted, in the prior art according to Fazio-Wong, multi-level memory cells are read out using control gate voltages that increase stepwise using a large number of steps separated from each other by small voltage increments. The magnitude of these increments (e.g., hundreds of mV or less) is on the order of memory cell threshold voltages, and is a small fraction (perhaps 10% or less) of the operating potential (perhaps 10 V). If the time delays associated with providing, say, 256 stable voltage levels for a multi-level memory cell having 256 Vt values are reduced by using a single fixed control gate potential, read out resolution is substantially diminished.

In contrast to the above techniques, the present invention reads out multi-level memory cells by generating and coupling a predetermined and preferably low number of large magnitude jump-like voltage changes to the control gates of the memory cells. The magnitude of the jumps can be a substantial fraction of the power supply level and will be many times the $\Delta$Vt levels associated with the memory cells.

Figure 4:
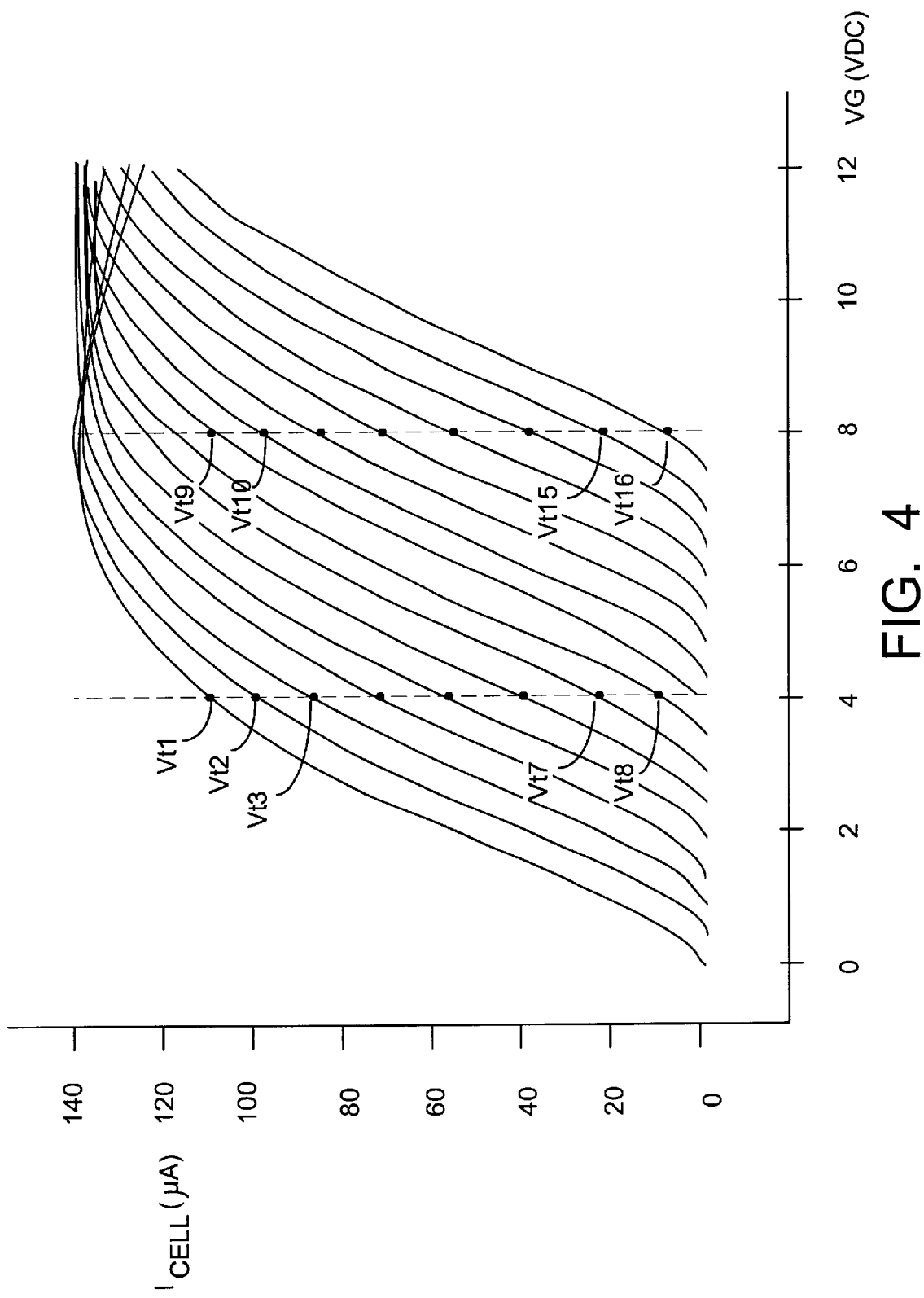
FIG. 4 depicts (computer-simulated) distribution of channel current (Ids) versus gate voltage (VG) for a multi-level memory cell, and shows preservation of substantially linear Ids resolution for lower and for higher values of Vt, as used in a read-out system, according to the present invention.

Referring now to FIG. 4, in one embodiment the number of large magnitude jump-like changes in the control gate voltage (VG) is two, and the magnitude of the two VG levels is 4 V and 8 V. Assume that the memory cells in questions that are to be read out have sixteen values of Vt: Vt1, Vt2, . . . Vt15, Vt16. In the left hand portion of FIG. 4, when VG=4 V, the lower level threshold values (here Vt1, Vt2, . . . Vt7, Vt8) may be read out. Next the VG level jumps from 4 V to 6 V, and when VG=8 V, the higher level threshold values (here Vt9, Vt10, . . . Vt15, Vt16) may be read out.

Note that in each case, when VG=4 V or when VG=8 V, there is substantial Ids (or $I_{CELL}$) linearity, e.g., read out resolution will be high throughout the Vt range. This is an improvement over the non-linear, resolution loss problems associated with Calligaro-Blythe type methods.

For example when VG=4 V, memory cells associated with lower Vt values (e.g., Vt1, Vt2 . . . Vt7, Vt8) will turn on, and Ids current flow through these memory cells will be quite linear and will provide better resolution than when VG is at a higher magnitude, for example as high as VG=8 V. Of course at the lower level of VG, e.g., VG=4 V, memory cells characterized by higher value Vt (e.g., Vt9 . . . Vt16) are not turned on and will conduct essentially no Ids current. (Such higher level Vt cells would exhibit poor read out resolution if attempted at VG=4 V). But at the higher level VG=8 V, all the memory cells will turn on since VG>Vt, whereupon memory cells associated with higher Vt (e.g., Vt9 . . . Vt16) conduct Ids in a linear fashion, as shown by FIG. 4. High resolution read out from these higher Vt cells thus takes place when VG=8 V, e.g., when VG is a magnitude sufficiently high to turn on the highest Vt memory cell, which is to say, to turn-on all Vt memory cells. Understandably, when VG=8 V, read out resolution of the lower Vt cells (e.g., Vt1 . . . Vt8) will diminish as these cells will saturate and be in a non-linear regime. But by applying the lower VG=4 V and reading out the lower Vt memory cells, and then applying the higher VG=8 V and reading out the higher Vt memory cells, high resolution read out is obtained from all cells. Thus, while use of a single fixed VG will not provide high resolution read out at all Vt levels, the use of several (e.g., perhaps two to four) jump-steps of high voltage VG can permit reading out all multi-level cells rapidly and with high resolution.

In FIG. 4, even through sixteen levels of Vt are present, there is no necessity to generate sixteen levels of VG, in which level that might otherwise have to be generated, at least according to the prior art, would be typically a few hundred mV separated from an adjacent level. Note too, there is no need to wait for each of sixteen stair-stepped voltage levels to stabilize before attempting read out, as in the prior art. Instead, if two jump-steps are used in the present invention, as shown in FIG. 4, the time improvement in reading out sixteen level Vt multi-level cells will be eight-fold compared to a Fazio-Wong type system. If four jump-steps were used in the present invention, the time improvement over a Fazio-Wong type system would be four-fold. However the time improvement realized by the present invention increases substantially as the number of Vt levels is increased. Thus, for a memory array comprising a plurality of 256 Vt level multi-level memory cells, the time advantage over a Fazio-Wong system would be 128 if two jump-steps were used in the present invention, and would be 64 if four jump-steps were used.

At each magnitude of the jump-step VG voltage, multiple levels of Vt read outs occur simultaneously, e.g., Vt1 through Vt8 levels when VG=4 V, and Vt9 through Vt16 when VG=8 V for the embodiment depicted by FIG. 4. It is seen that Vt-groups of memory cells may be defined, e.g., a lower Vt range of Vt1 . . . Vt8, and a higher Vt range of Vt9 . . . Vt16, as exemplified by FIG. 4. Read out of the lower Vt range of memory cells occurs during application of the lower VG voltage, e.g., VG=4 V in FIG. 4, and read out of the higher Vt range occurs during application of the higher VG voltage, e.g., VG=8 V in FIG. 4.

In addition to providing a high speed, high resolution method of reading out multi-level memory cells, sensing according to the present invention can in essence extend the Vt range. Assume for example that twenty-four Vt levels are to be defined, rather than the sixteen Vt levels used in FIG. 4. Thus, a low Vt level group (Vt1 . . . Vt8) may defined having cell Vt values from say 1 V to 3.1 V. A middle Vt level group (Vt9 . . . Vt16) may be defined having Vt values from say 3.4 V to 5.5 V, and a high Vt level group (Vt17 . . . Vgt24) may be defined having Vt values from say 5.8 V to 7.9 V. In this twenty-four Vt level example, $\Delta$Vt is about 0.3 V.

Figure 5:
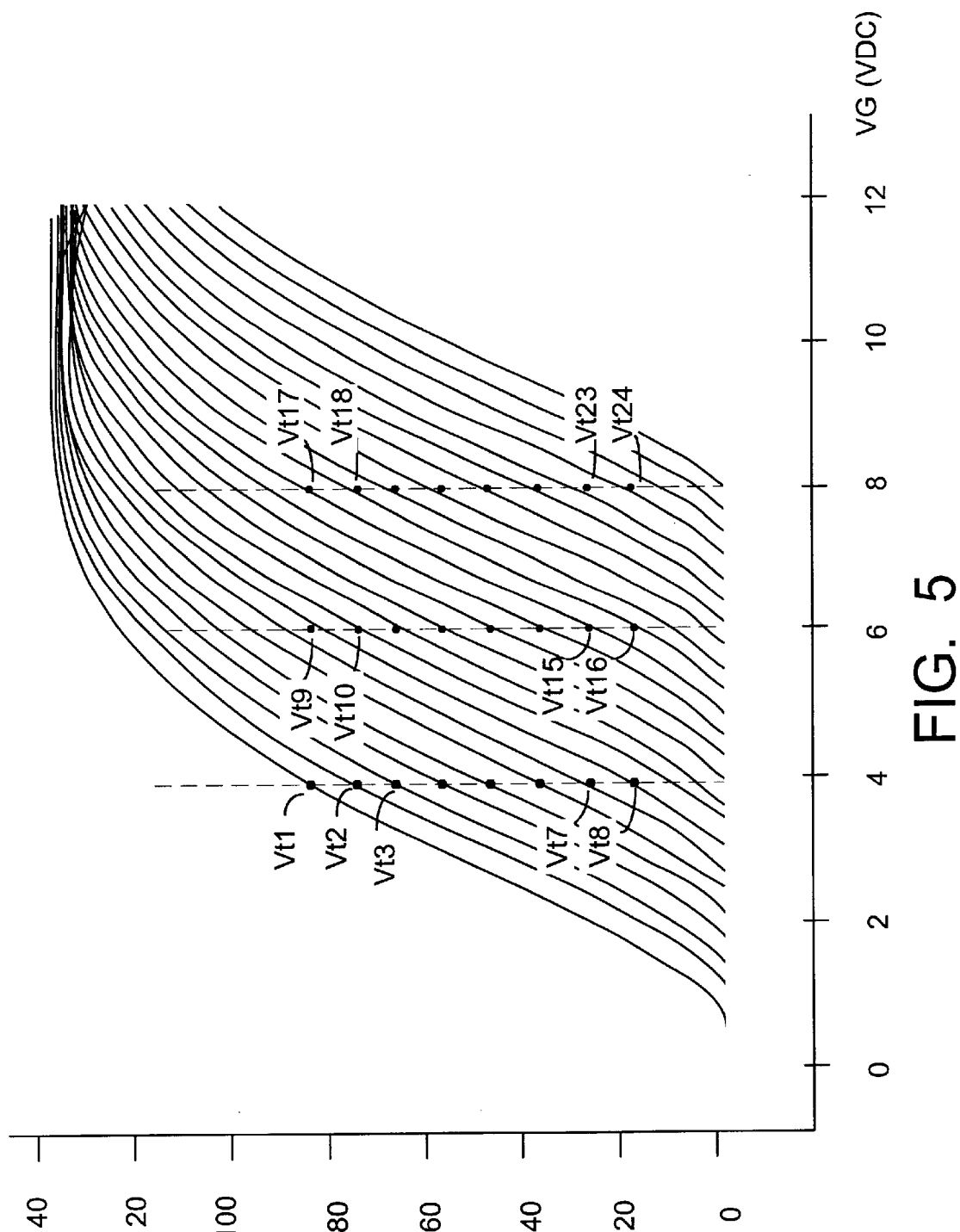
FIG. 5 depicts (computer-simulated) distribution of channel current (Ids) versus gate voltage (VG) for a multi-level memory cell, and shows preservation of substantially linear Ids resolution for lower, for intermediate, and for higher values of Vt, as used in a read-out system, according to the present invention.

FIG. 5 depicts Ids current versus VG for an embodiment having twenty-four Vt levels, where the number of jump-steps is three, and the VG voltage coupled to the control gates of the multi-level memory cells is 4 V, then 6 V, then 8 V, although for the specific Vt voltages enumerated above, jump-step magnitudes might be 4 V, 6.5 V, and 9 V. Understandably, more than three jump-steps could be provided, if desired.

In the embodiment shown in FIG. 5, at VG=4 V, the lower Vt level cells (e.g., Vt1, Vt2, . . . Vt7, Vt8) conduct current in a substantially linear regime and may now be read out, but the higher level cells (e.g., Vt9 . . . Vt24) do not yet conduct current. VG is then jumped from 4 V to 6 V, whereupon memory cells having middle range Vt (Vt9, Vt10, . . . Vt15, Vt16) conduct current in a linear regime and may now be read out. Of course the lower level Vt cells also conduct, but in a non-linear regime, and the higher level Vt cells (Vt17, Vt18, . . . Vt23, Vt24 do not yet conduct current. VG is next jumped to 8 V whereupon the higher level Vt cells (Vt17 . . . Vt24) conduct current in a linear regime and may now be read out. Since VG is now greater than Vt for all of the memory cells, cells characterized by Vt1, Vt2, . . . Vt15, Vt16 also conduct current, but in a non-linear regime.

The number of jump-steps, e.g., two in FIG. 4, three in FIG. 5, etc., and the magnitudes of the large jump-step voltages, e.g., 4 V, 6 V, 8 V, etc. will be designed into the system depending upon the resolution and read out time that is required. Increasing the number of jump-steps can, if the number of steps is made very large, contribute to memory cell stress.

The present invention further includes reference cells that help improve tracking against variation in fabrication process, power supply, and temperature. Further, the present invention preferably uses high sensitivity, high noise immunity DRAM-type sense amplifiers to further improve read out performance.

In the preferred embodiment, the VG gate voltage is simultanously applied to the reference cells (e.g., 16 such cells in an appropriate embodiment) and to the multi-level memory cells. In another embodiment, the multiple reference cells are divided into groups, e.g., two groups, wherein a first group includes lower value Vt cells, and a second group includes higher Vt cells. When reading out, the lower magnitude gate voltage is applied to the first group to achieve high read out resolution among the lower Vt level memory cells. Meanwhile, the higher gate voltage is applied to the second group to achieve high resolution in the higher Vt level memory cells.

Figure 1:
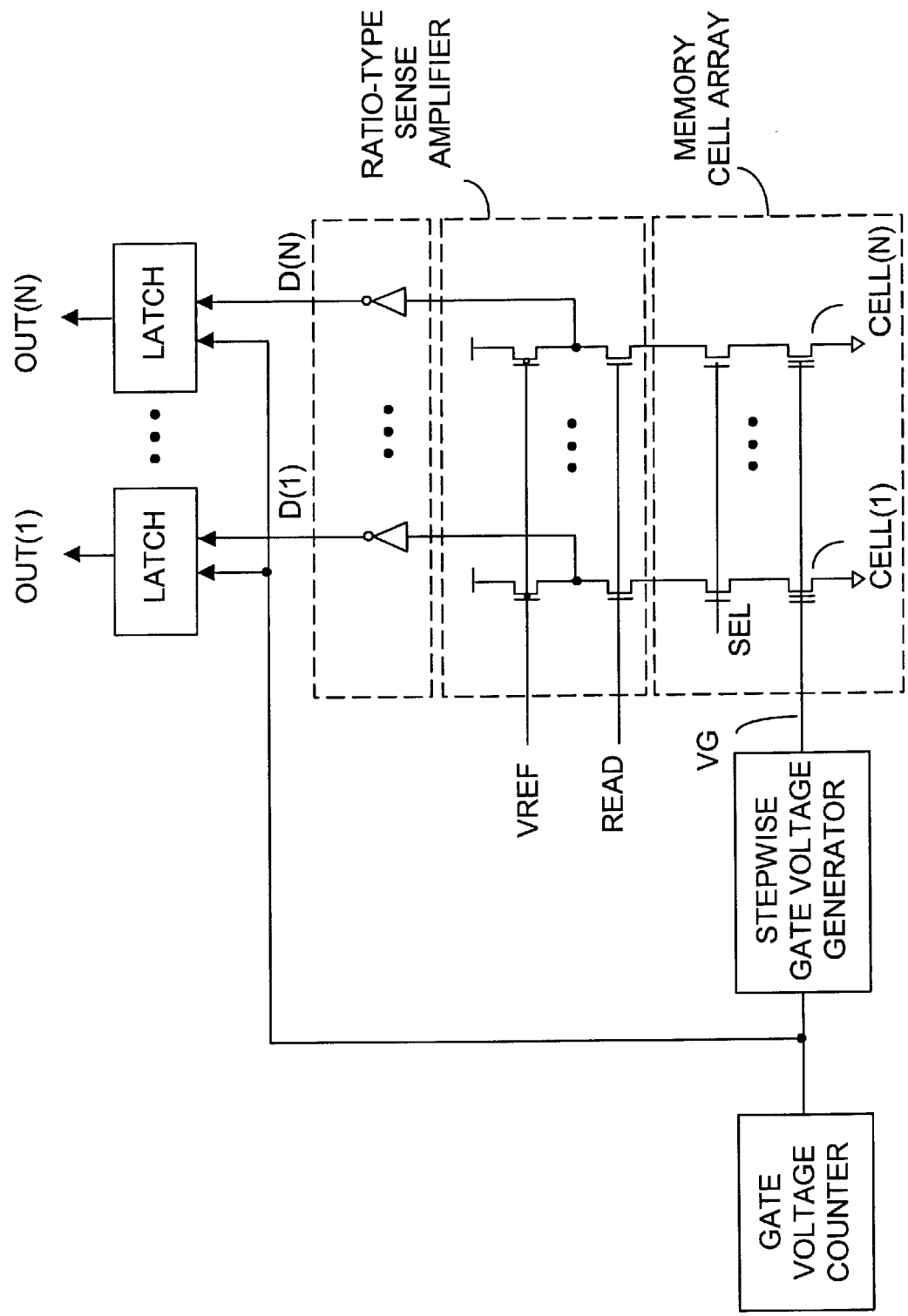
FIG. 1 (depicts a system for reading data from multi-level memory cells, according to the prior art.
Figure 2:
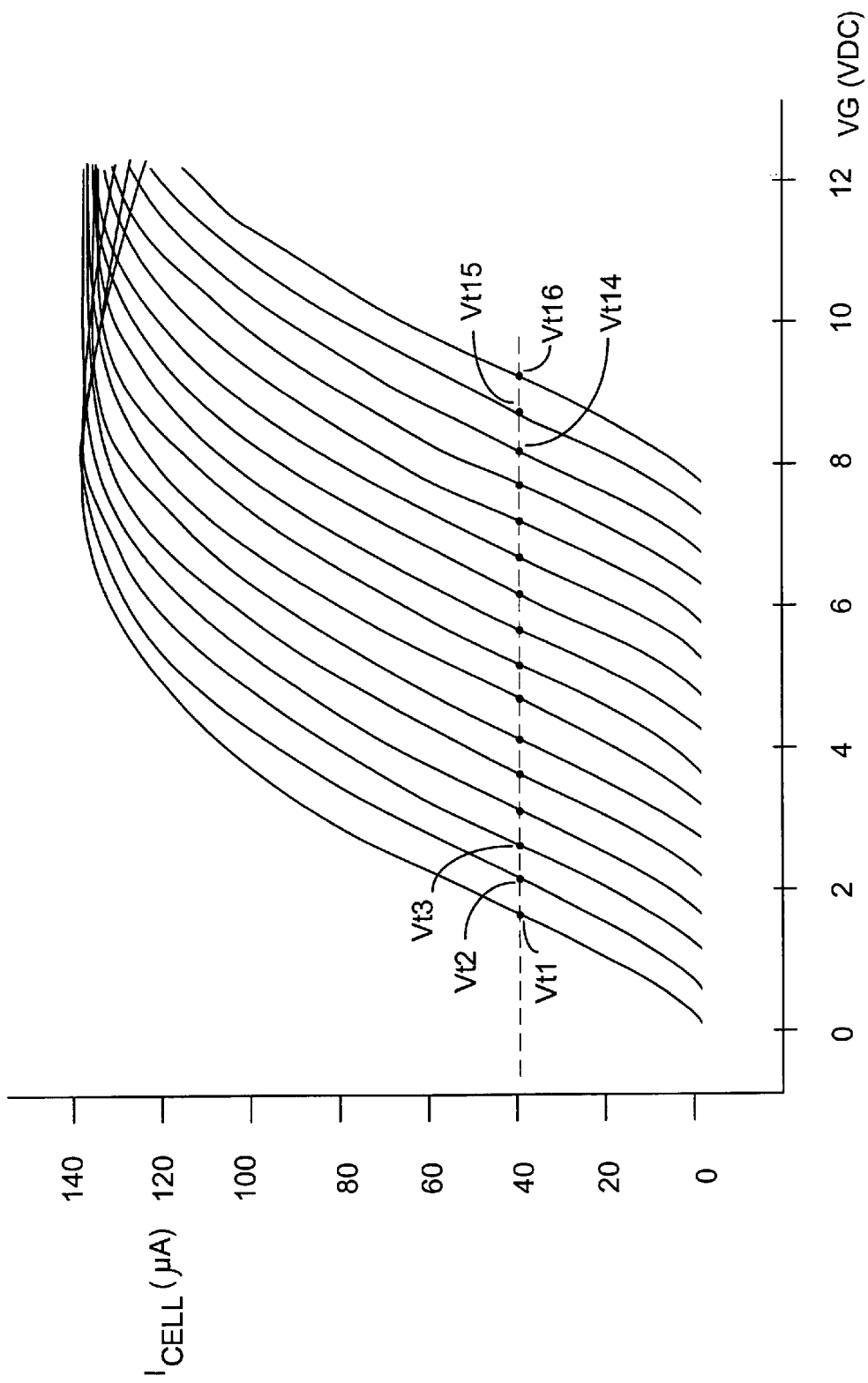
FIG. 2 depicts distribution of channel current (Ids) versus gate voltage (VG) for a multi-level memory cell, and shows various Vt values for a given value of Ids as used in Fazio-Wong type read-out systems, according to the prior art.
Figure 3:
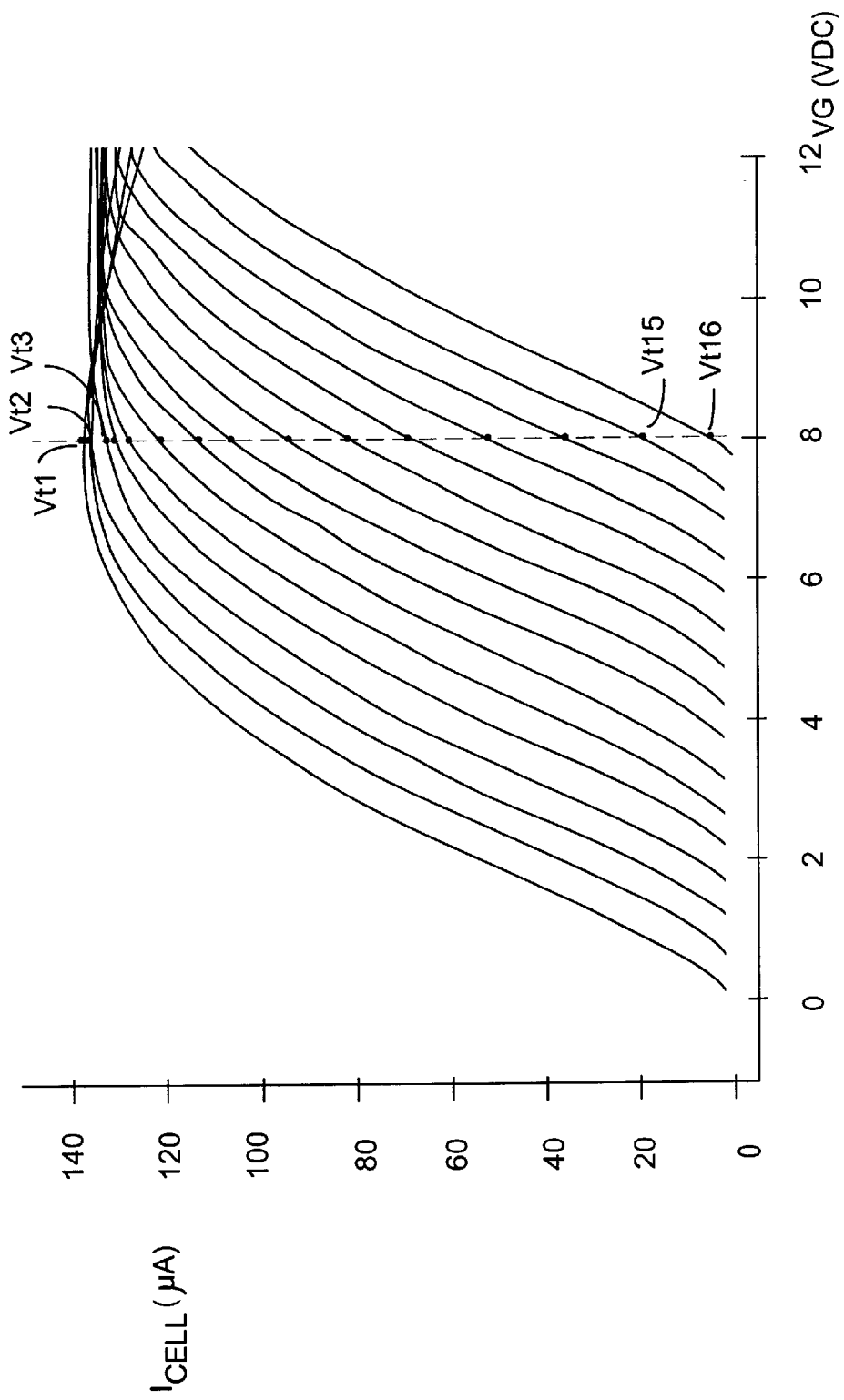
FIG. 3 depicts (computer simulated) distribution of channel current (Ids) versus gate voltage (VG) for a multi-level memory cell, and shows loss of Ids resolution at a given value of VG as memory cell saturation occurs, as used in Calligaro-Blythe type read-out systems, according to the prior art.
Figure 7:
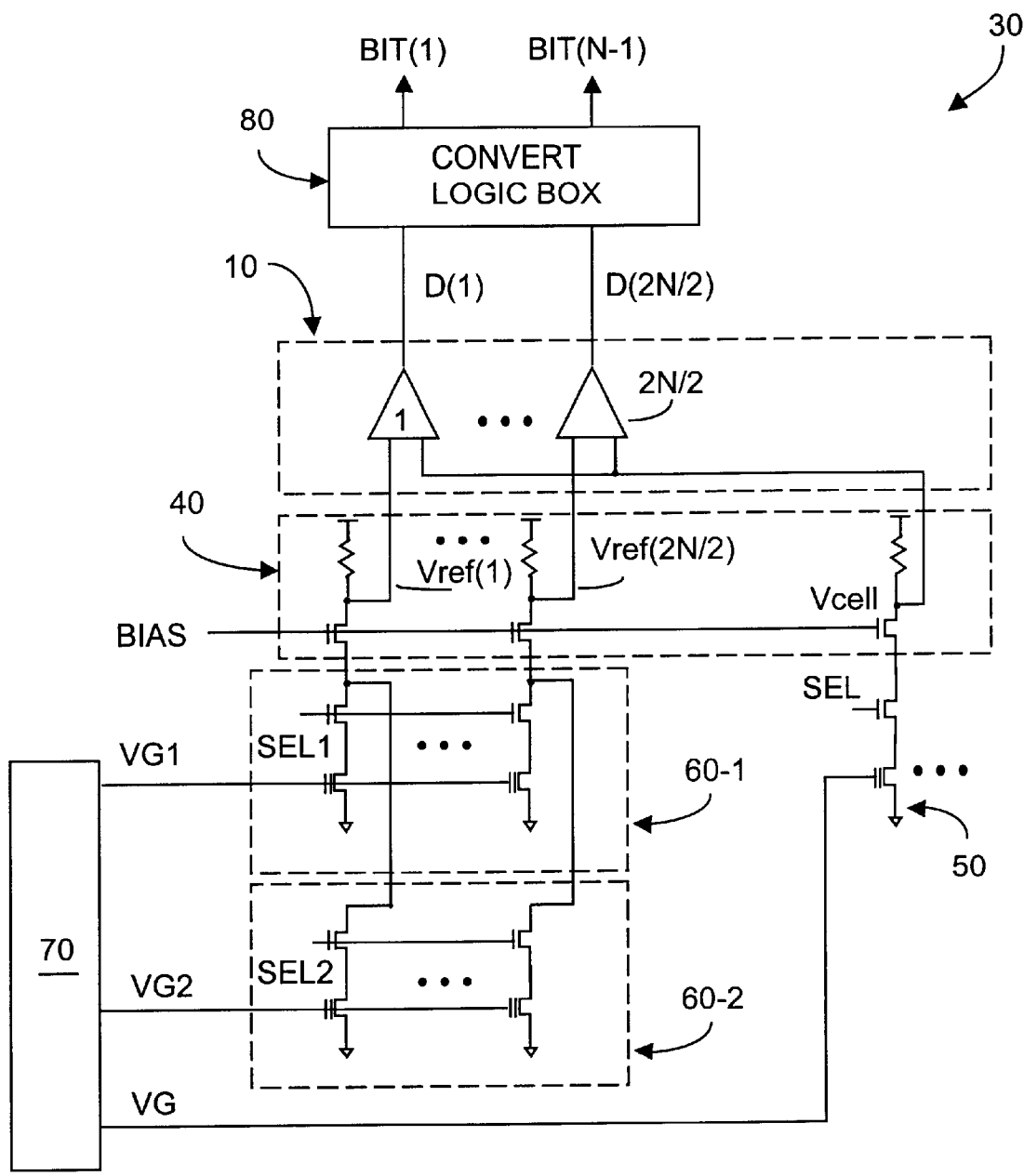
FIG. 7 is an exemplary block diagram of a multi-level cell memory system with high voltage-step read-out, according to the present invention.

FIGS. 6A–6 and FIG. 7 depict exemplary systems to implement the present invention. It is first noted that while using a preferably small number of large magnitude jump-steps can provide rapid and high resolution read out of multi-level memory cells, the read out sense amplifier can diminish the overall effective read out resolution. For example, ratio-type sense amplifiers as shown in prior art FIG. 1 compare cell current with a reference current (generated by a NMOS device, a PMOS device, a resistor, or any other current loading) and transfer the ratio of cell current and reference current into an analog voltage output.

For multi-level memory cells, the cell current difference between levels can be very small, and the differential voltage to be read out with a sense amplifier can also be very small, perhaps 10 mV. This small differential voltage requires a sense amplifier having high sensitivity but also high noise-immunity to detect. But conventional differential-type ratio sense amplifiers as used in the prior art are not good candidates in a high resolution system due to the poor noise-immunity exhibited by such sense amplifiers.

In a preferred embodiment, as a substitute for prior art differential-type sense amplifiers, the invention provides a DRAM-type sense amplifier 10, such as shown in FIG. 6A to sense Ids current flow in multi-level memory cells. Advantageously, DRAM-type sense amplifier 10 uses a two-phase, sampling-and-evaluation operation. Referring to FIGS. 6A–6F, during the sampling phase defined by a Sample Enable signal (see FIGS. 6B, 6C) DRAM-type sense amplifier 10 samples an input voltage ($V_{CELL}$) and samples a reference voltage ($V_{REF}$) from data lines to a sensing node (DATA and its complement DATAB, see FIG. 6F in which Vref is shown in bold for clarity).

During an evaluation phase, sense amplifier 10 isolates the sensing nodes from the data lines, and a cross-coupled latch circuit 20 is activated to develop the differential input voltages into a full Vdd-Vss range. This mode of operation assures higher noise-immunity than prior art sense amplifiers.

For example, prior art differential-type sense amplifiers do not latch or de-couple the input voltage from the sensing nodes, thus putting the sense amplifier into a high-gain regime all the time. This prior art high-gain regime operation makes it difficult to maintain a stable and accurate output during the entire, typically noisy, sensing process. In addition to advantageously decoupling the input voltage from the sense nodes, DRAM-type sense amplifier 10 provides very high sensitivity, e.g., voltage levels in the few mV range can be sensed. Thus, the present invention preferably employs a DRAM-type sense amplifier to sense multi-level memory cells.

FIG. 7 is an exemplary block diagram for a system 30 implementing the present invention. System 30 includes a plurality of DRAM-type sense amplifiers 10, for example such as was described with reference to FIGS. 6A–6F a plurality of ratio-type sense amplifier 40, the multi-level memory cells 50 (only one of an array of the cells being shown for clarity), a first reference group of multi-level memory cells 60-1, a second reference group of multi-level memory cells 60-2, a gate voltage generator 70, and a convert logic box unit 80. Each DRAM-type sense amplifier 10 receives a first input from the selected memory cell, and a second input from one of the reference cells. Converter logic unit 80 receive outputs from the sense amplifiers and converts the outputs into digital data, e.g., BIT(1), etc.

The multi-level memory cells preferably are divided into several groups, such as group (a) to group (h), with a plurality of multi-level memory cells in each group. The Vt for cells in each group is incremental, as was described earlier herein. Gate voltage generator 70 generates the jump-step voltages VG coupled to the gates of selected memory cells, and also to the gates of reference cells.

Assume read operation will now take place. Assume also that $2^N$ levels of Vt are stored in a multi-level memory cell, and that there are $2^N$ reference cells divided into two groups G1 (60-1) and G2 (60-2) with $2^N/2$ reference cells in each group. Gate voltage generator 70 will first output a first gate voltage VG1 to the first reference cells in group G1 (60-1) and to the selected memory cell. As shown in FIG. 7, the drain of the reference cells and of the memory cell are connected to ratio-type sense amplifiers 40, which convert the currents of each reference cell and the memory cell current into $2^N/2$ reference voltages $Vref_{(1)}$ to $Vref_{(2N/2)}$ and into cell voltage Vcell.

Block 10 includes $2^N/2$ DRAM-type sense amplifiers, and each sense amplifier receives and compares Vcell with one of the reference voltage, $Vref_{(1)}$ to $Vref_{(2N/2)}$, and then generates the comparison results, $D_{(1)}$ to $D_{(2N/2)}$. The logic block then receives and converts the results $D_{(1)}$ to $D_{(2N/2)}$ into N–1 bit digital data. If a memory cell's Vt does not belong to the first group of reference cells this can be noticed from the N–1 bit data, and Gate Voltage Generator 70 will generate a second gate voltage, VG2 to the second reference cells group G2 (60-2) and to the selected cell. Then, the read process of comparing currents of the selected cell with that of the $2^N/2$ reference cells in the second group as above-described is repeated, to determine the memory cell's N–1 bit data. Thus, only two jump-steps of gate voltage are needed to read the multi-level memory cell. Note too that this described method of sensing can be used to implement parallel sensing wherein the above-described two jump-step gate voltage is applied to more than one selected memory cell. The configuration noted in FIG. 7 would be increased as needed to implement a parallel read operation.

Modifications and variations may be made to the disclosed embodiments without departing from the subject and spirit of the invention as defined by the following claims.

What is claimed is:

1. A method of reading out data from a plurality of multi-level memory cells characterizable by a plurality of Vt levels, the method comprising the following steps:

(a) coupling to a control gate of said multi-level memory cells a jump-step voltage gate signal having a first magnitude level and a higher second magnitude separated from said first magnitude level by at least one volt;

(b) when said voltage gate signal is at said first magnitude level, reading out from said multi-level memory cells current levels associated with ones of said cells characterized by lower magnitude levels of said Vt levels; and (c) when said voltage gate signal is at said second magnitude level, reading out from said multi-level memory cells current levels associated with ones of said cells characterized by higher magnitude levels of said Vt levels.

2. The method of claim 1, wherein said first magnitude level and said second magnitude level of said voltage gate signal are separated by at least two volts.

3. The method of claim 1, wherein said first magnitude level and said second magnitude level of said voltage gate signal are separated by at least three volts.

4. The method of claim 1, wherein step (b) and step (c) is carried out at least in part using a DRAM-type sense amplifier.

5. The method of claim 1, further including divided said cells into at least three groups definable as a first block of said cells associated with a lower range of said Vt levels, a second block of units associated with a middle range of said Vt levels, and a third block of units associated with a higher range of said Vt levels.

6. The method of claim 1, wherein a number of said Vt levels exceeds a value selected from a group consisting of (i) four, (ii) sixteen, (iii) thirty-two, (iv) sixty-four, (v) one-hundred twenty-eight, (vi) two-hundred fifty-six, and (vii) five hundred twelve.

7. The method of claim 1, further including providing a plurality of reference memory cells characterizable by a plurality of Vt values, and divisible into groups according to blocks of said Vt values.

8. A system to read out out data from a plurality of multi-level memory cells characterizable by a plurality of Vt levels, the system comprising;

a voltage generator outputting a jump-step voltage gate signal having a first magnitude level and a higher second magnitude separated from said first magnitude level by at least one volt, said jump-step voltage gate signal being coupled to control gates of said cells; and means for reading out from said multi-level memory cells current levels associated with ones of said cells characterized by lower magnitude levels of said Vt levels when said voltage gate signal is at said first magnitude level; and for readout of from said multi-level memory cells current levels associated with ones of said cells characterized by higher magnitude levels of said Vt levels when said voltage gate signal is at said second magnitude level.

9. The system of claim 8, wherein said first magnitude level and said second magnitude level of said voltage gate signal are separated by at least two volts.

10. The system of claim 8, wherein said first magnitude level and said second magnitude level of said voltage gate signal are separated by at least three volts.

11. The system of claim 8, wherein said means for reading out includes a DRAM-type sense amplifier.

12. The system of claim 8, wherein said cells are divided into at least three groups definable as a first block of said cells associated with a lower range of said Vt levels, a second block of units associated with a middle range of said Vt levels, and a third block of units associated with a higher range of said Vt levels.

13. The system of claim 8, wherein a number of said Vt levels exceeds a value selected from a group consisting of (i) four, (ii) sixteen, (iii) thirty-two, (iv) sixty-four, (v) one-hundred twenty-eight, (vi) two-hundred fifty-six, and (vii) five hundred twelve.

14. The system of claim 8, further including a plurality of reference memory cells characterizable by a plurality of Vt values, and divisible into groups according to blocks of said Vt values.

15. The system of claim 8, further including means for compensating for at least one of (a) variation in fabrication process, (b) power supply magnitude coupled to said system, and (c) temperature of said system.

* * * * *